(12) United States Patent
Murase (10) Patent No.: US 6,630,409 B2
(45) Date of Patent: Oct. 7, 2003

(54) METHOD OF FORMING A POLYCIDE ELECTRODE IN A SEMICONDUCTOR DEVICE

(75) Inventor: Hiroshi Murase, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/817,061

(22) Filed: Mar. 27, 2001

(65) Prior Publication Data

US 2001/0027024 A1 Oct. 4, 2001

(30) Foreign Application Priority Data

Mar. 29, 2000 (JP) .......................... 2000-091656

(51) Int. Cl.[7] .............................................. H01L 21/00
(52) U.S. Cl. ..................... 438/719; 216/79; 438/735
(58) Field of Search .................... 438/706, 707, 438/708, 709, 710, 719, 721, 735, 723, 743; 216/67, 79, 2

(56) References Cited

U.S. PATENT DOCUMENTS 5,527,730 A * 6/1996 Kayaoka et al. ............. 439/60
5,569,614 A * 10/1996 Kataoka et al. ............. 437/39
5,580,808 A * 12/1996 Kataoka et al. ............. 437/48
5,712,196 A * 1/1998 Ibok ............................ 437/200
5,963,812 A * 10/1999 Kataoka et al. ............. 438/304

FOREIGN PATENT DOCUMENTS

| JP | 4-303963 | 10/1992 |
|----|----------|---------|
| JP | 5-291514 | 11/1993 |
| JP | 6-132243 | 5/1994 |
| JP | 2682410 | 8/1997 |
| JP | 10-270381 | 10/1998 |

* cited by examiner

Primary Examiner—William A. Powell
(74) Attorney, Agent, or Firm—Young & Thompson (57) ABSTRACT

A method of forming an emitter electrode of a bipolar transistor. The emitter electrode includes a double-layered structure of a polysilicon layer and a refractory metal silicide layer. The method includes the steps of removing a natural oxide film from a surface of a polysilicon layer by a sputter-etching process using inert gas ions in the range of acceleration energy from 5 eV to 50 eV; depositing a refractory metal layer on the surface of the polysilicon layer; and carrying out a heat treatment to cause a silicidation reaction to form a refractory metal silicide layer over the polysilicon layer.

27 Claims, 11 Drawing Sheets

RF-plasma etching process at low energy

RF-plasma etching process at low energy

METHOD OF FORMING A POLYCIDE ELECTRODE IN A SEMICONDUCTOR DEVICE

BACKGROUND OF THE INVENTION

The present invention relates to a method of forming a bipolar transistor, and more particularly to a method of forming a polycide emitter electrode in a bipolar transistor.

A polycide emitter electrode of a bipolar transistor comprises a double layered structure of a polysilicon layer and a refractory metal layer overlying the polysilicon layer. The refractory metal layer is deposited on the polysilicon layer by a sputtering method after a natural oxide film is removed by a surface treatment using a fluorine acid solution. This conventional surface treatment causes the following problems. The natural oxide film non-uniformly resides over the polysilicon layer, and then the refractory metal layer is deposited on the non-uniformly residual natural oxide film over the polysilicon layer. This non-uniformly residual natural oxide film on the interface between the refractory metal layer and the polysilicon layer causes the resistance of the emitter to increase or vary, thereby make it difficult to obtain stable performances of the bipolar transistor.

In order to solve the above problem, it was proposed to carry out a radio frequency plasma etching process using argon ions at a high acceleration energy for removing the natural oxide film on the polysilicon layer. The radio frequency plasma etching process, however, raises another problem. If a radio frequency power is high, argon ions are implanted into the polysilicon layer, whereby a damage is provided to the surface of the polysilicon layer, resulting in a rough and damaged surface of the polysilicon layer. The implanted argon in the polysilicon layer is gasified by a post heat treatment process for forming the bipolar transistor to generate argon gas. This argon gas generation causes the refractory metal layer to be peeled from the polysilicon layer and also causes an expansion of the refractory metal layer. The peeling and expansion of the refractory metal layer cause drop of the manufacturing yield of the bipolar transistor and also causes the variation of the emitter resistance. The variation of the emitter resistance results in variation in performance and characteristics of the bipolar transistor.

In the above circumstances, it had been required to develop a novel method of forming an emitter electrode of a bipolar transistor free from the above problem.

SUMMARY OF THE INVENTION

Accordingly, it is an object of the present invention to provide a novel method of forming an emitter electrode of a bipolar transistor free from the above problems.

It is a further object of the present invention to provide a novel method of forming an emitter electrode of a bipolar transistor allowing a high manufacturing yield.

It is a still further object of the present invention to provide a novel method of forming an emitter electrode of a bipolar transistor having a uniform emitter resistance.

It is yet a further object of the present invention to provide a novel method of forming an emitter electrode of a bipolar transistor having uniform performances and characteristics.

It is yet a further object of the present invention to provide a novel method of forming an emitter electrode of a bipolar transistor free from any argon gas generation in a post-heat treatment for forming the bipolar transistor.

It is yet a further object of the present invention to provide a novel method of forming an emitter electrode of a bipolar transistor free from any peeling of the refractory metal layer from the polysilicon layer due to an argon gas generation in a post-heat treatment for forming the bipolar transistor.

It is yet a further object of the present invention to provide a novel method of forming an emitter electrode of a bipolar transistor free from any expansion of the refractory metal layer due to an argon gas generation in a post-heat treatment for forming the bipolar transistor.

It is yet a further object of the present invention to provide a novel method of forming an emitter electrode of a bipolar transistor, wherein an interface of a refractory metal layer and a polysilicon layer is free of any damage.

It is another object of the present invention to provide a novel method of forming an electrode of a semiconductor device free from the above problems.

It is a further object of the present invention to provide a novel method of forming an electrode of a semiconductor device allowing a high manufacturing yield.

It is a still further object of the present invention to provide a novel method of forming an electrode of a semiconductor device having a uniform emitter resistance.

It is yet a further object of the present invention to provide a novel method of forming an electrode of a semiconductor device having uniform performances and characteristics.

It is yet a further object of the present invention to provide a novel method of forming an electrode of a semiconductor device free from any argon gas generation in a post-heat treatment for forming the bipolar transistor.

It is yet a further object of the present invention to provide a novel method of forming an electrode of a semiconductor device free from any peeling of the refractory metal layer from the polysilicon layer due to an argon gas generation in a post-heat treatment for forming the bipolar transistor.

It is yet a further object of the present invention to provide a novel method of forming an electrode of a semiconductor device free from any expansion of the refractory metal layer due to an argon gas generation in a post-heat treatment for forming the bipolar transistor.

It is yet a further object of the present invention to provide a novel method of forming an electrode of a semiconductor device, wherein an interface of a refractory metal layer and a polysilicon layer is free of any damage.

The present invention provides a method of forming an emitter electrode of a bipolar transistor, the emitter electrode comprising a double-layered structure of a polysilicon layer and a refractory metal silicide layer. The method comprises the steps of: removing a natural oxide film from a surface of a polysilicon layer by a sputter-etching process using inert gas ions in the range of acceleration energy from 5 eV to 50 eV; depositing a refractory metal layer on the surface of the polysilicon layer; and carrying out a heat treatment to cause a silicidation reaction to form a refractory metal silicide layer over the polysilicon layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a method of forming an emitter electrode of a bipolar transistor, the emitter electrode comprising a double-layered structure of a polysilicon layer and a refractory metal silicide layer. The method comprises the steps of: removing a natural oxide film from a surface of a polysilicon layer by a sputter-etching process using inert gas ions in the range of acceleration energy from 5 eV to 50 eV; depositing a refractory metal layer on the surface of the polysilicon layer; and carrying out a heat treatment to cause a silicidation reaction to form a refractory metal silicide layer over the polysilicon layer.

It is preferable that the inert gas ions comprise argon ions.

It is also preferable that the sputter-etching process is a radio frequency plasma etching process.

It is also preferable that the refractory metal layer is deposited with keeping the surface of the polysilicon layer from an oxygen atmosphere after the natural oxide film is completely removed. Further, it is also preferable that the refractory metal layer is deposited in the same vacuum chamber in which the sputter-etching process has been carried out.

It is also preferable to further comprise the step of: patterning laminations of the refractory metal silicide layer and the polysilicon layer.

It is also preferable that the sputter-etching process is carried out by applying a bias voltage in the range of 5 V to 50 V.

As described above, the natural oxide film is completely removed from the top surface of the polysilicon layer by the sputer-etching process such as the radio frequency plasma etching process using the inert gas ions with the low acceleration energy in the range of 5 eV to 50 eV in order to obtain a clean surface of the polysilicon layer without introduction of the inert gas ions into the polysilicon layer, before the refractory metal layer is then deposited over the top surface of the polysilicon layer. The adhesiveness between the refractory metal layer and the polysilicon layer is improved. In the post heat treatment, no gas generation from the polysilicon layer is caused, because the inert gas ions in the radio frequency plasma etching process are accelerated by the low energy so that the inert gas ions are not implanted into the polysilicon layer. No inert gas generation causes no expansion of the polysilicon layer nor peeling of the refractory metal layer from the polysilicon layer. As a result, a stable resistance of the electrode can be obtained and the stable device performances and characteristics can also be obtained.

The second present invention provides a method of forming an emitter electrode of a bipolar transistor, the emitter electrode comprising a double-layered structure of a polysilicon layer and a refractory metal silicide layer. The method comprises the steps of: removing a natural oxide film from a surface of a polysilicon layer by a sputter-etching process using inert gas ions by applying a bias voltage level in the range from 5 V to 50 V; depositing a refractory metal layer on the surface of the polysilicon layer; and carrying out a heat treatment to cause a silicidation reaction to form a refractory metal silicide layer over the polysilicon layer.

It is preferable that the inert gas ions comprise argon ions.

It is also preferable that the sputter-etching process is a radio frequency plasma etching process.

It is also preferable that the refractory metal layer is deposited with keeping the surface of the polysilicon layer from an oxygen atmosphere after the natural oxide film is completely removed. Further, it is preferable that the refractory metal layer is deposited in the same vacuum chamber in which the sputter-etching process has been carried out.

It is also preferable to further comprise the step of: patterning laminations of the refractory metal silicide layer and the polysilicon layer.

It is also preferable that the inert gas ions are accelerated in the range of 5 eV to 50 eV.

As described above, the natural oxide film is completely removed from the top surface of the polysilicon layer by the sputer-etching process such as the radio frequency plasma etching process using the inert gas ions with the low acceleration energy in the range of 5 eV to 50 eV in order to obtain a clean surface of the polysilicon layer without introduction of the inert gas ions into the polysilicon layer, before the refractory metal layer is then deposited over the top surface of the polysilicon layer. The adhesiveness between the refractory metal layer and the polysilicon layer is improved. In the post heat treatment, no gas generation from the polysilicon layer is caused, because the inert gas ions in the radio frequency plasma etching process are accelerated by the low energy so that the inert gas ions are not implanted into the polysilicon layer. No inert gas generation causes no expansion of the polysilicon layer nor peeling of the refractory metal layer from the polysilicon layer. As a result, a stable resistance of the electrode can be obtained and the stable device performances and characteristics can also be obtained.

The third present invention provides a method of forming a double-layered structure of a polysilicon layer and a refractory metal silicide layer. The method comprises the steps of: removing a natural oxide film from a surface of a polysilicon layer by a sputter-etching process using inert gas ions in the range of acceleration energy from 5 eV to 50 eV; depositing a refractory metal layer on the surface of the polysilicon layer; and carrying out a heat treatment to cause a silicidation reaction to form a refractory metal silicide layer over the polysilicon layer.

It is also preferable that the inert gas ions comprise argon ions.

It is also preferable that the sputter-etching process is a radio frequency plasma etching process.

It is also preferable that the refractory metal layer is deposited with keeping the surface of the polysilicon layer from an oxygen atmosphere after the natural oxide film is completely removed. Further, it is preferable that the refractory metal layer is deposited in the same vacuum chamber in which the sputter-etching process has been carried out.

It is also preferable that the sputter-etching process is carried out by applying a bias voltage in the range of 5 V to 50 V.

As described above, the natural oxide film is completely removed from the top surface of the polysilicon layer by the sputer-etching process such as the radio frequency plasma etching process using the inert gas ions with the low acceleration energy in the range of 5 eV to 50 eV in order to obtain a clean surface of the polysilicon layer without introduction of the inert gas ions into the polysilicon layer, before the refractory metal layer is then deposited over the top surface of the polysilicon layer. The adhesiveness between the refractory metal layer and the polysilicon layer is improved. In the post heat treatment, no gas generation from the polysilicon layer is caused, because the inert gas ions in the radio frequency plasma etching process are accelerated by the low energy so that the inert gas ions are not implanted into the polysilicon layer. No inert gas generation causes no expansion of the polysilicon layer nor peeling of the refractory metal layer from the polysilicon layer. As a result, a stable resistance of the electrode can be obtained and the stable device performances and characteristics can also be obtained.

The fourth present invention provides a method of forming a double-layered structure of a polysilicon layer and a refractory metal silicide layer. The method comprises the steps of: removing a natural oxide film from a surface of a polysilicon layer by a sputter-etching process using inert gas ions by applying a bias voltage level in the range from 5 V to 50 V; depositing a refractory metal layer on the surface of the polysilicon layer; and carrying out a heat treatment to cause a silicidation reaction to form a refractory metal silicide layer over the polysilicon layer.

It is also preferable that the inert gas ions comprise argon ions.

It is also preferable that the sputter-etching process is a radio frequency plasma etching process.

It is also preferable that the refractory metal layer is deposited with keeping the surface of the polysilicon layer from an oxygen atmosphere after the natural oxide film is completely removed. Further, it is also preferable that the refractory metal layer is deposited in the same vacuum chamber in which the sputter-etching process has been carried out.

It is also preferable that the inert gas ions are accelerated in the range of 5 eV to 50 eV.

As described above, the natural oxide film is completely removed from the top surface of the polysilicon layer by the sputter-etching process such as the radio frequency plasma etching process using the inert gas ions with the low acceleration energy in the range of 5 eV to 50 eV in order to obtain a clean surface of the polysilicon layer without introduction of the inert gas ions into the polysilicon layer, before the refractory metal layer is then deposited over the top surface of the polysilicon layer. The adhesiveness between the refractory metal layer and the polysilicon layer is improved. In the post heat treatment, no gas generation from the polysilicon layer is caused, because the inert gas ions in the radio frequency plasma etching process are accelerated by the low energy so that the inert gas ions are not implanted into the polysilicon layer. No inert gas generation causes no expansion of the polysilicon layer nor peeling of the refractory metal layer from the polysilicon layer. As a result, a stable resistance of the electrode can be obtained and the stable device performances and characteristics can also be obtained.

PREFERRED EMBODIMENT

First Embodiment

A first embodiment according to the present invention will be described in detail with reference to the drawings. FIGS. 1A through 1F are fragmentary cross sectional elevation views illustrative of bipolar transistors in sequential steps involved in a novel method of forming the same in a first embodiment in accordance with the present invention.

Figure 1A:
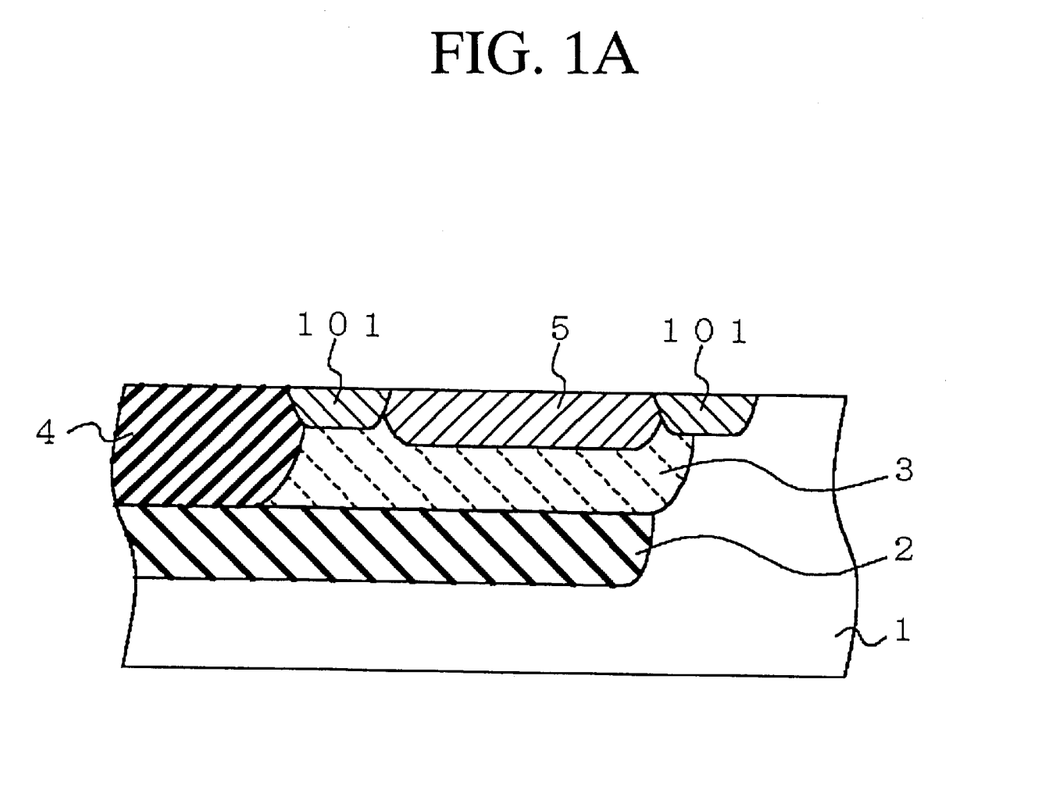
FIGS. 1A through 1F are fragmentary cross sectional elevation views illustrative of bipolar transistors in sequential steps involved in a novel method of forming the same in a first embodiment in accordance with the present invention.

With reference to FIG. 1A, isolation layers 101 are selectively formed on a top surface of a p-type silicon substrate 1. An ion-implantation of an n-type impurity is carried out at a high ion-implantation energy to form an n-type collector buried region 2 in the p-type silicon substrate 1. An ion-implantation of an n-type impurity is carried out at a lower ion-implantation energy to form a shallow n-type collector region 3 over the n-type collector buried region 2 in the p-type silicon substrate 1, wherein a bottom of the shallow n-type collector region 3 is bounded with a top of the n-type collector buried region 2. A selective ion-implantation of an n-type impurity is carried out at a lower ion-implantation energy to selectively form an n-type collector plug region 4 having a high impurity concentration in a part of the shallow n-type collector region 3, wherein the n-type collector plug region 4 has the same level as the shallow n-type collector region 3. The bottom of the n-type collector plug region 4 is bounded with the top of the n-type collector buried region 2. The n-type collector plug region 4 has an electrical junction with the n-type collector buried region 2. A selective ion-implantation of a p-type impurity is carried out at a lower ion-implantation energy to selectively form a p-type base region 5 in a selected upper region of the shallow n-type collector region 3, wherein the bottom level of the p-type base region 5 is shallower than the bottom level of the n-type collector region 3.

Figure 1B:
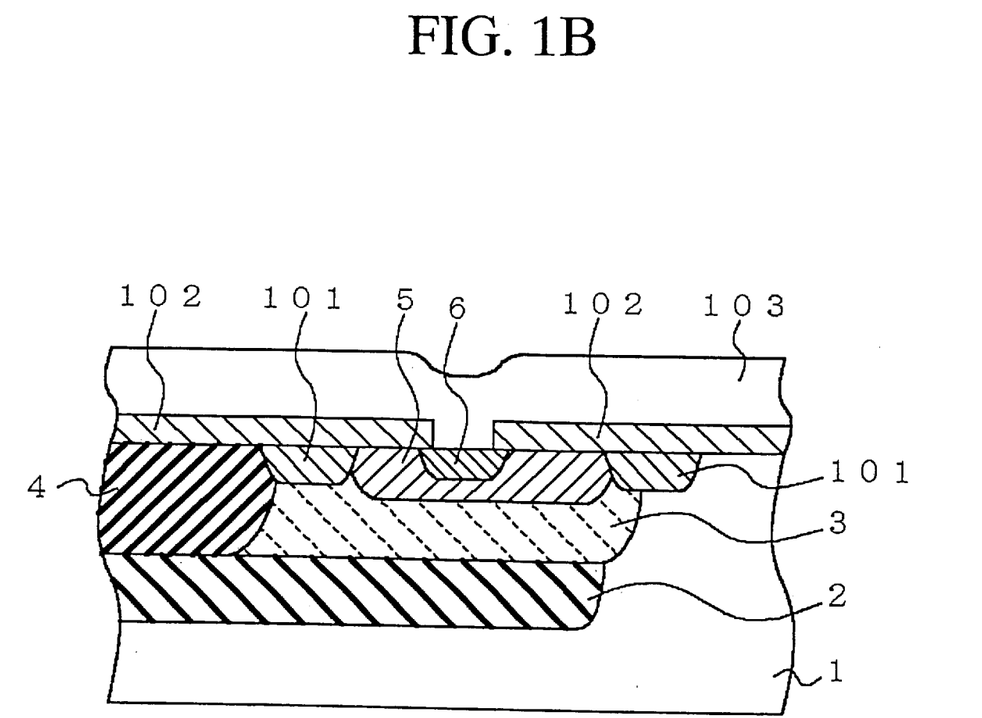

With reference to FIG. 1B, an insulating film 102 is entirely formed over a top surface of the substrate 1 so that the insulating layer 102 extends over the top surface of the isolation layers 101, the top surface of the n-type collector plug region 4, and the top surface of the p-type base region 5. An opening is formed in the insulating film 102 over an emitter formation region, so that a part of the top surface of the p-type base region 5 is shown through the opening of the insulating film 102. A polysilicon layer 103 is entirely deposited on the insulating film 102 and on the part of the top surface of the p-type base region 5 shown through the opening of the insulating film 102 by a low pressure chemical vapor deposition method, so that the polysilicon layer 103 is partially in contact with the shown part of the top surface of the p-type base region 5 shown through the opening of the insulating film 102. An ion-implantation of arsenic is then carried out to introduce arsenic ions into the polysilicon layer 103. A heat treatment is then carried out to cause a thermal diffusion of arsenic from the polysilicon layer 103 to a selected upper region of the p-type base region 5, wherein the selected upper region of the p-type base region 5 is positioned in the vicinity of the opening of the insulating film 102, whereby an n-type emitter region 6 is selectively formed in the selected upper region of the p-type base region 5 in the vicinity of the opening of the insulating film 102. A bottom level of the n-type emitter region 6 is shallower than the bottom level of the p-type base region 5.

Figure 1C:
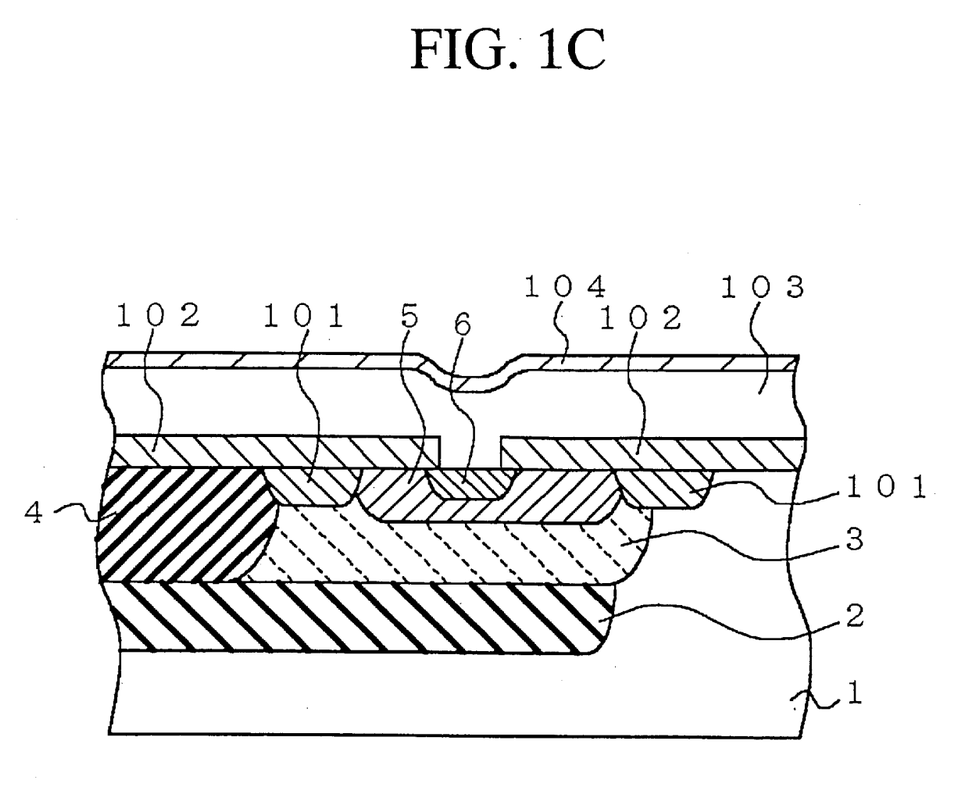

With reference to FIG. 1C, a natural oxide film 104 is naturally formed on a top surface of the polysilicon layer 103 in a time duration until the n-type emitter region 6 is formed after the polysilicon layer 103.

Figure 1D:
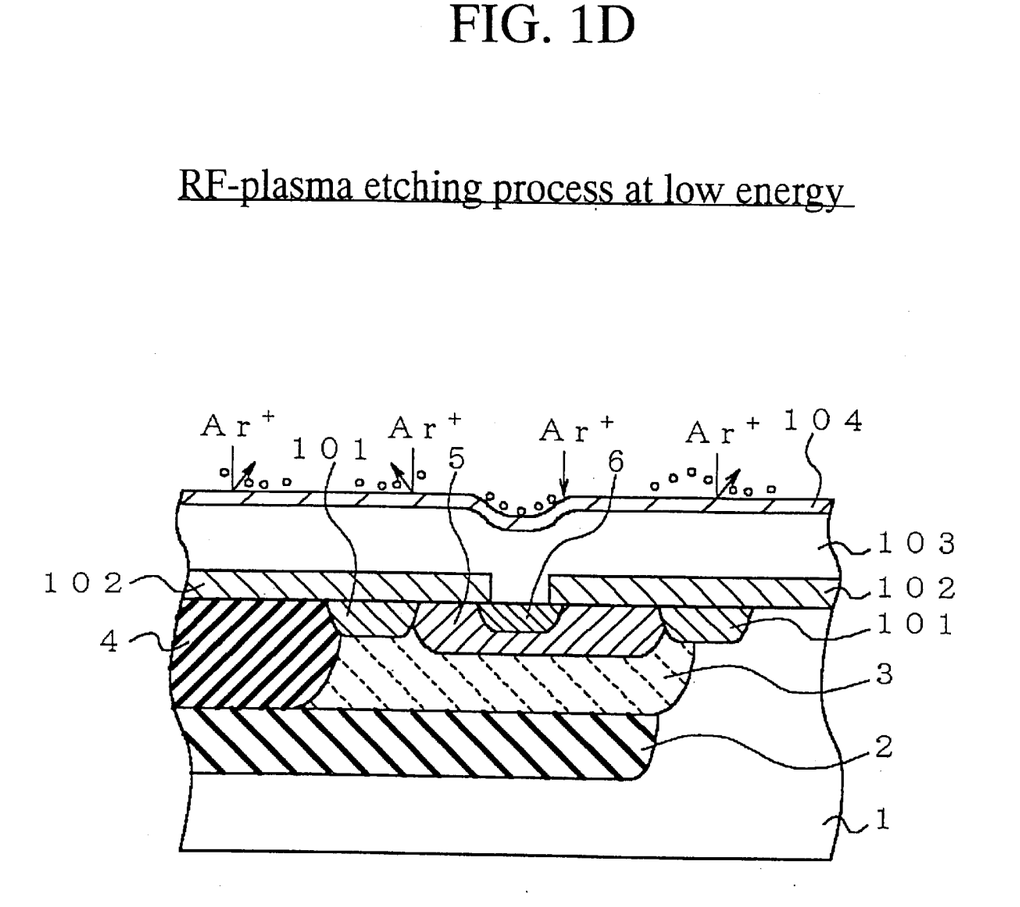

With reference to FIG. 1D, the natural oxide film 104 is then removed by a radio frequency plasma etching process. This radio frequency plasma etching process is carried out by use of argon ions in a vacuum chamber under conditions of a flow rate of 100 sccm, a pressure of 10 mTorr, a radio frequency power of 50 W and a time period of 20 seconds, wherein the substrate is applied with a low bias voltage of about 25 V to provide argon ions with an energy of about 25 eV, whereby the natural oxide film 104 is then removed without any argon ion implantation into the polysilicon layer 103.

Figure 1E:
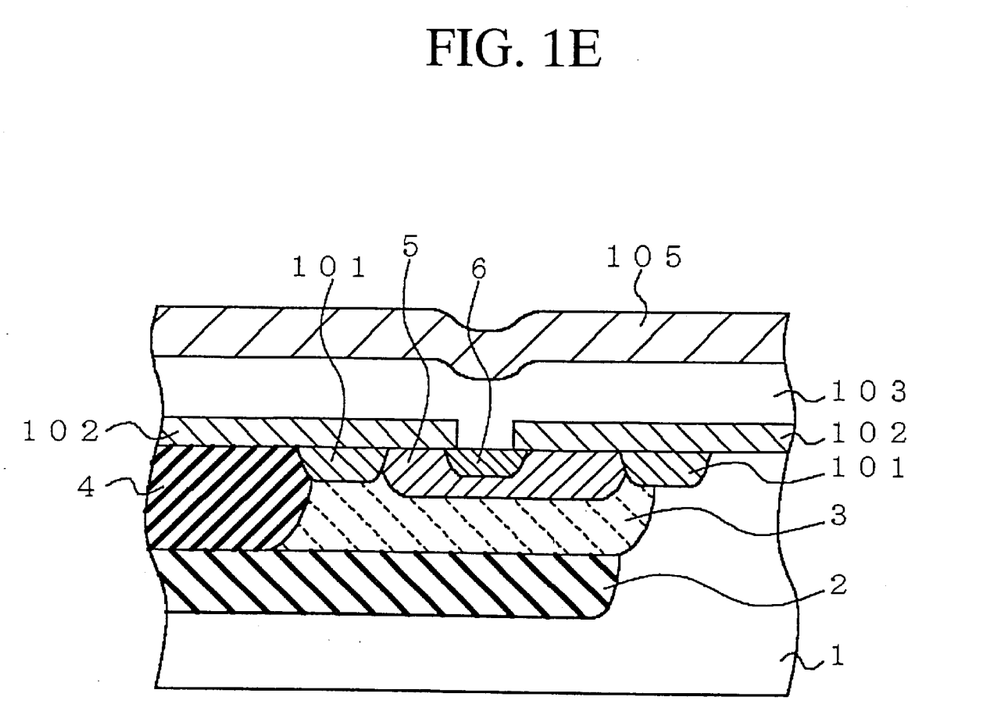

With reference to FIG. 1E, in the same vacuum chamber, a tungsten layer is then entirely deposited over the top surface of the polysilicon layer 103 by a sputtering method. A heat treatment is then carried out to cause a silicidation reaction to form a tungsten silicide layer 105 over the polysilicon layer 103.

Figure 1F:
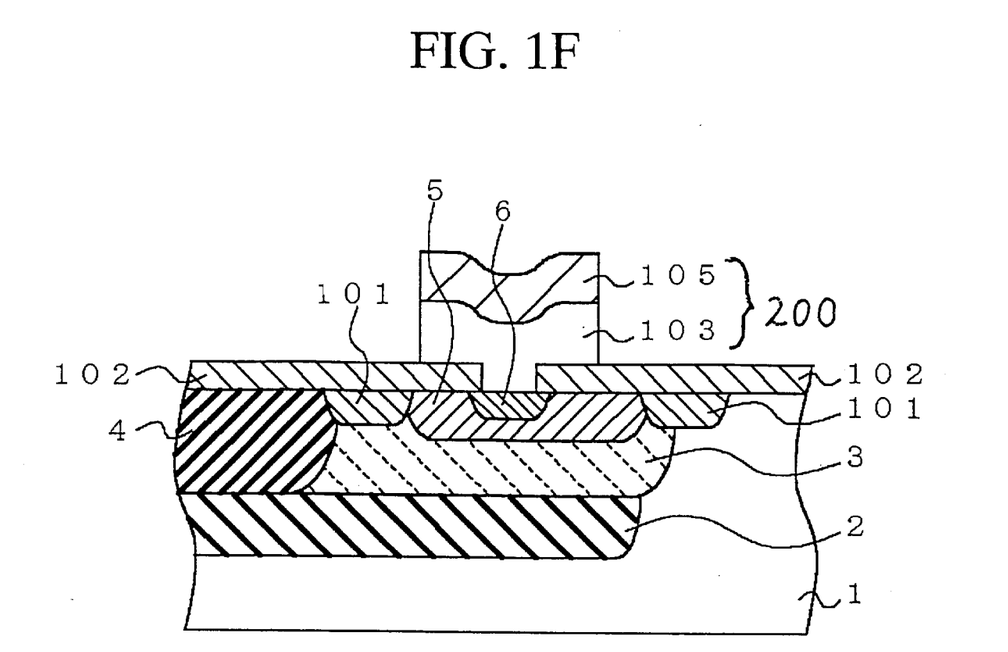

With reference to FIG. 1F, a lithography and a subsequent dry etching process are carried out to pattern the tungsten silicide layer 105 and the polysilicon layer 103, whereby an emitter electrode 200 is formed which comprises the patterned lamination structure of the tungsten silicide layer 105 and the polysilicon layer 103.

As described above, the natural oxide film is completely removed from the top surface of the polysilicon layer by the radio frequency plasma etching process using the argon ions with the low acceleration energy at 25 eV to obtain a clean surface of the polysilicon layer without introduction of the argon ions into the polysilicon layer, before the refractory metal layer or the tungsten layer is deposited over the top surface of the polysilicon layer. The adhesiveness between the refractory metal layer and the polysilicon layer is improved. In the post heat treatment, no argon gas generation from the polysilicon layer is caused, because the argon ions in the radio frequency plasma etching process are accelerated by the low energy so that the argon ions are not implanted into the polysilicon layer. No argon gas generation causes no expansion of the polysilicon layer nor peeling of the refractory metal layer from the polysilicon layer. As a result, a stable resistance of the emitter electrode can be obtained and the stable device performances and characteristics can also be obtained.

Second Embodiment

A second embodiment according to the present invention will be described in detail with reference to the drawings. FIGS. 2A through 2E are fragmentary cross sectional elevation views illustrative of Bi-CMOS devices in sequential steps involved in another novel method of forming the same in a second embodiment in accordance with the present invention.

Figure 2A:
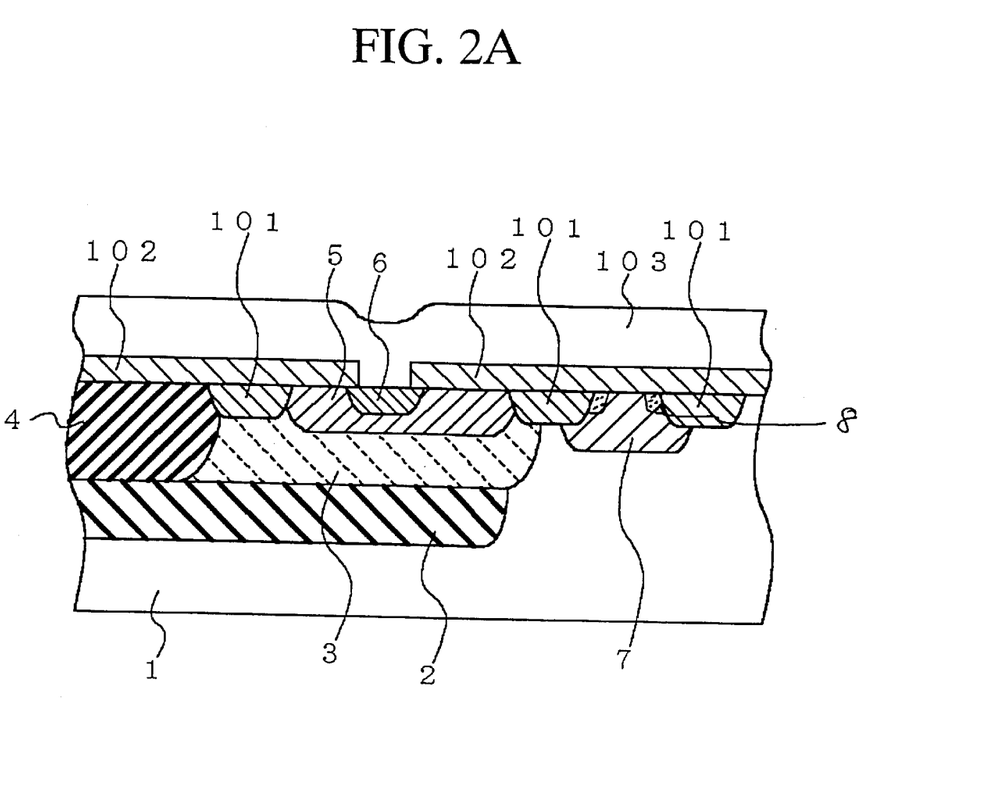
FIGS. 2A through 2E are fragmentary cross sectional elevation views illustrative of Bi-CMOS devices in sequential steps involved in another novel method of forming the same in a second embodiment in accordance with the present invention.

With reference to FIG. 2A, isolation layers 101 are selectively formed on a top surface of a p-type silicon substrate 1. An ion-implantation of an n-type impurity is carried out at a high ion-implantation energy to form an n-type collector buried region 2 in the p-type silicon substrate 1. An ion-implantation of an n-type impurity is carried out at a lower ion-implantation energy to form a shallow n-type collector region 3 over the n-type collector buried region 2 in the p-type silicon substrate 1, wherein a bottom of the shallow n-type collector region 3 is bounded with a top of the n-type collector buried region 2. A selective ion-implantation of an n-type impurity is carried out at a lower ion-implantation energy to selectively form an n-type collector plug region 4 having a high impurity concentration in a part of the shallow n-type collector region 3, wherein the n-type collector plug region 4 has the same level as the shallow n-type collector region 3. The bottom of the n-type collector plug region 4 is bounded with the top of the n-type collector buried region 2. The n-type collector plug region 4 has an electrical junction with the n-type collector buried region 2. A selective ion-implantation of a p-type impurity is carried out at a lower ion-implantation energy to selectively form a p-type base region 5 in a selected upper region of the shallow n-type collector region 3, wherein the bottom level of the p-type base region 5 is shallower than the bottom level of the n-type collector region 3. A well region 7 is then selectively formed in the p-type silicon substrate by an ion-implantation. Source and drain regions 8 are selectively formed in the well region 7.

Further, an insulating film 102 is entirely formed over a top surface of the substrate 1 so that the insulating layer 102 extends over the top surface of the isolation layers 101, the top surface of the n-type collector plug region 4, and the top surface of the p-type base region 5 as well as the top surface of the n-well region 7. An opening is formed in the insulating film 102 over an emitter formation region, so that a part of the top surface of the p-type base region 5 is shown through the opening of the insulating film 102. A polysilicon layer 103 is entirely deposited on the insulating film 102 and on the part of the top surface of the p-type base region 5 shown through the opening of the insulating film 102 by a low pressure chemical vapor deposition method, so that the polysilicon layer 103 is partially in contact with the shown part of the top surface of the p-type base region 5 shown through the opening of the insulating film 102. An ion-implantation of arsenic is then carried out to introduce arsenic ions into the polysilicon layer 103. A heat treatment is then carried out to cause a thermal diffusion of arsenic from the polysilicon layer 103 to a selected upper region of the p-type base region 5, wherein the selected upper region of the p-type base region 5 is positioned in the vicinity of the opening of the insulating film 102, whereby an n-type emitter region 6 is selectively formed in the selected upper region of the p-type base region 5 in the vicinity of the opening of the insulating film 102. A bottom level of the n-type emitter region 6 is shallower than the bottom level of the p-type base region 5.

Figure 2B:
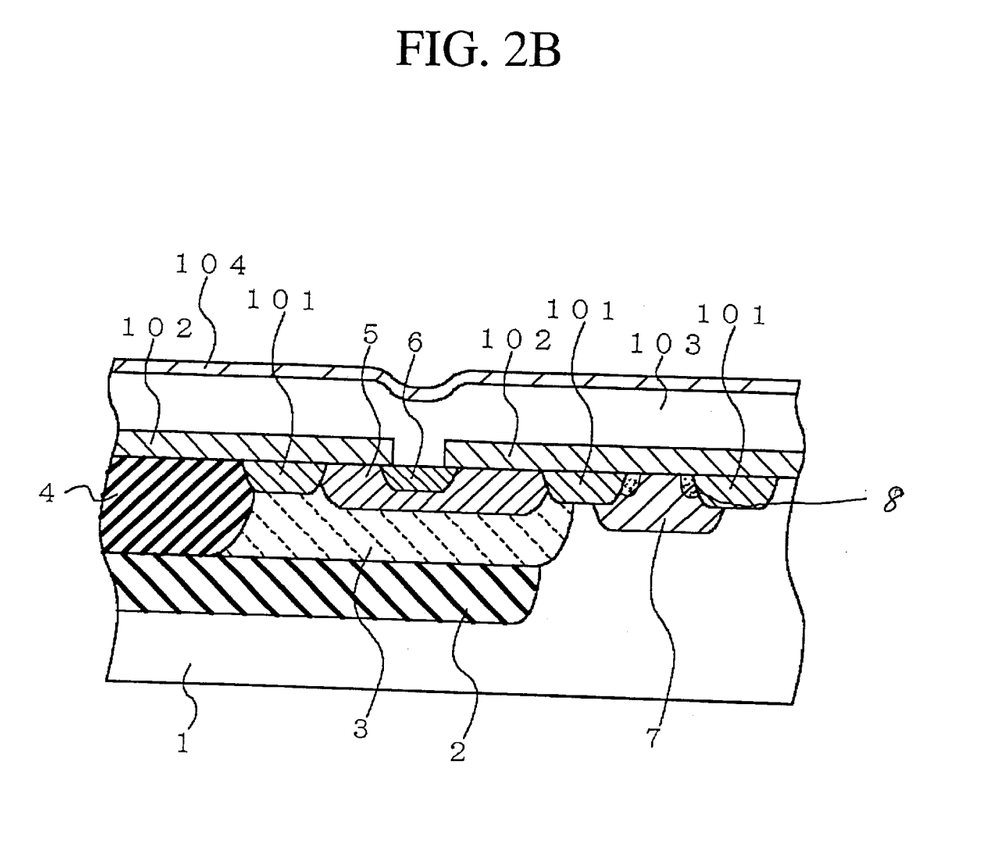

With reference to FIG. 2B, a natural oxide film 104 is naturally formed on a top surface of the polysilicon layer 103 in a time duration until the n-type emitter region 6 is formed after the polysilicon layer 103.

Figure 2C:
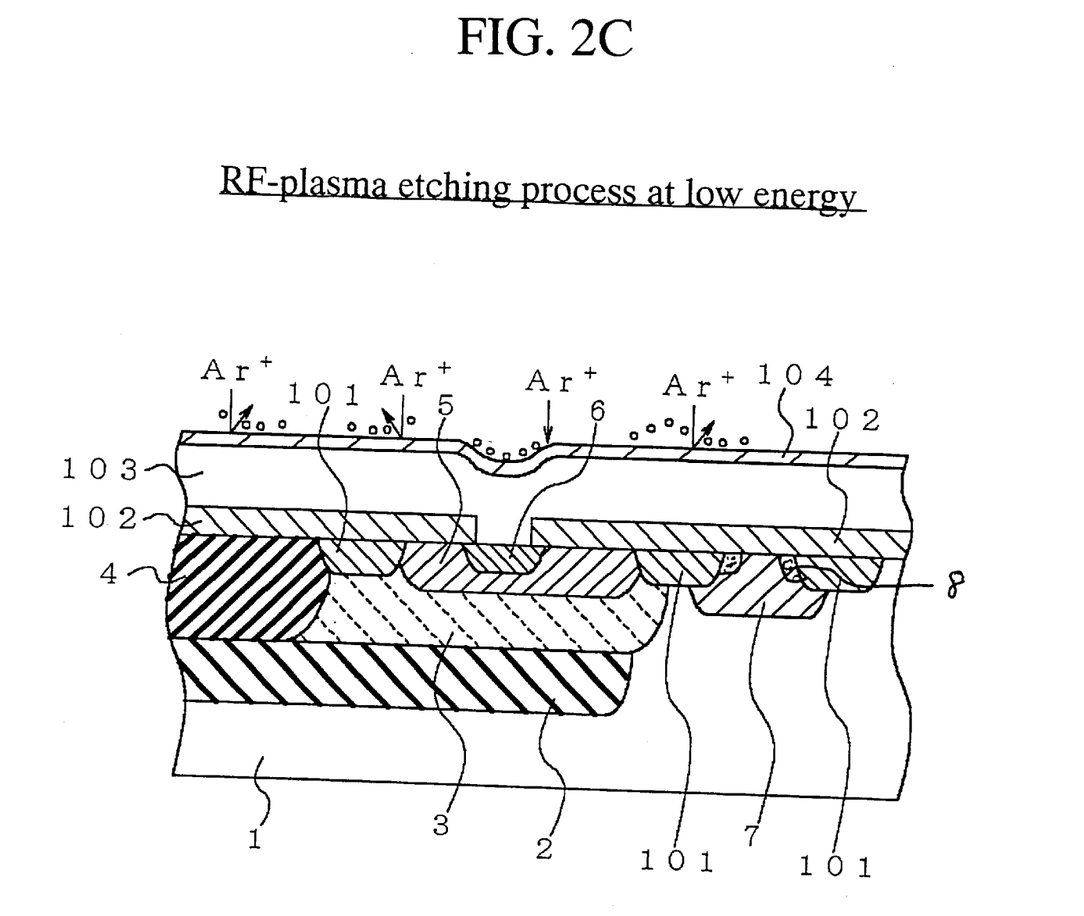

With reference to FIG. 2C, the natural oxide film 104 is then removed by a radio frequency plasma etching process. This radio frequency plasma etching process is carried out by use of argon ions in a vacuum chamber under conditions of a flow rate of 100 sccm, a pressure of 10 mTorr, a radio frequency power of 50 W and a time period of 20 seconds, wherein the substrate is applied with a low bias voltage of about 25 V to provide argon ions with an energy of about 25 eV, whereby the natural oxide film 104 is then removed without any argon ion implantation into the polysilicon layer 103.

Figure 2D:
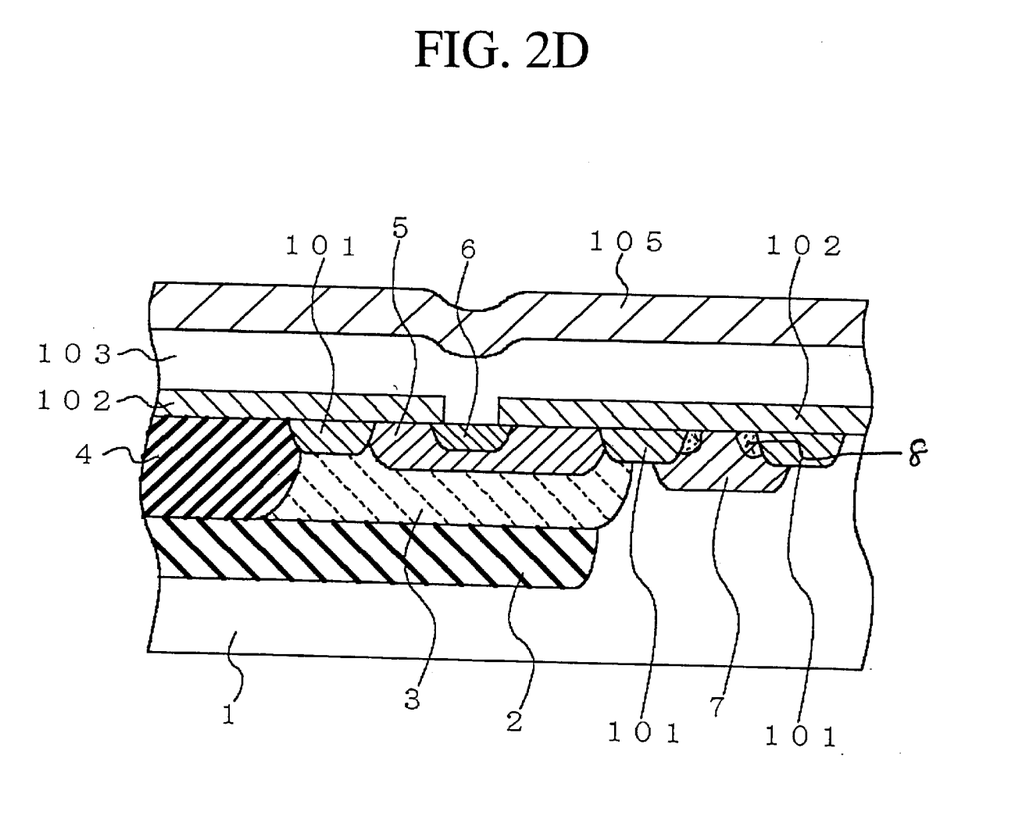

With reference to FIG. 2D, in the same vacuum chamber, a tungsten layer is then entirely deposited over the top surface of the polysilicon layer 103 by a sputtering method. A heat treatment is then carried out to cause a silicidation reaction to form a tungsten silicide layer 105 over the polysilicon layer 103.

Figure 2E:
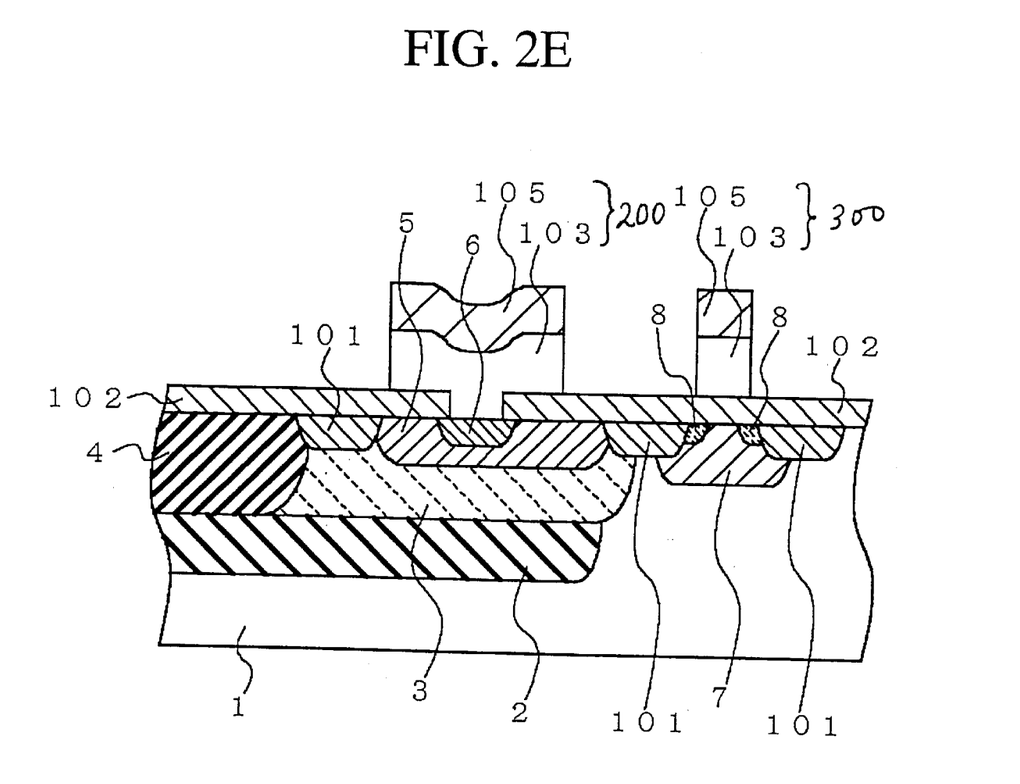

With reference to FIG. 2E, a lithography and a subsequent dry etching process are carried out to pattern the tungsten silicide layer 105 and the polysilicon layer 103, whereby an emitter electrode 200 is formed which comprises the patterned lamination structure of the tungsten silicide layer 105 and the polysilicon layer 103 as well as a gate electrode 300 is formed which comprises the patterned lamination structure of the tungsten silicide layer 105 and the polysilicon layer 103.

As described above, the natural oxide film is completely removed from the top surface of the polysilicon layer by the radio frequency plasma etching process using the argon ions with the low acceleration energy at 25 eV to obtain a clean surface of the polysilicon layer without introduction of the argon ions into the polysilicon layer, before the refractory metal layer or the tungsten layer is deposited over the top surface of the polysilicon layer. The adhesiveness between the refractory metal layer and the polysilicon layer is improved. In the post heat treatment, no argon gas generation from the polysilicon layer is caused, because the argon ions in the radio frequency plasma etching process are accelerated by the low energy so that the argon ions are not implanted into the polysilicon layer. No argon gas generation causes no expansion of the polysilicon layer nor peeling of the refractory metal layer from the polysilicon layer. As a result, a stable resistance of the emitter electrode can be obtained and the stable device performances and characteristics can also be obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming an emitter electrode of a bipolar transistor, said emitter electrode comprising a double-layered structure of a polysilicon layer and a refractory metal silicide layer, said method comprising the steps of:
   removing a natural oxide film from a surface of a polysilicon layer by a sputter-etching process using inert gas ions in the range of acceleration energy from 5 eV to 50 eV;
   depositing a refractory metal layer on said surface of said polysilicon layer; and
   carrying out a heat treatment to cause a silicidation reaction to form a refractory metal silicide layer over said polysilicon layer.

2. The method as claimed in claim 1, wherein said inert gas ions comprise argon ions.

3. The method as claimed in claim 1, wherein said sputter-etching process is a radio frequency plasma etching process.

4. The method as claimed in claim 1, wherein said refractory metal layer is deposited with keeping said surface of said polysilicon layer from an oxygen atmosphere after said natural oxide film is completely removed.

5. The method as claimed in claim 4, wherein said refractory metal layer is deposited in the same vacuum chamber in which said sputter-etching process has been carried out.

6. The method as claimed in claim 1, further comprising the step of: patterning laminations of the refractory metal silicide layer and the polysilicon layer.

7. The method as claimed in claim 1, wherein said sputter-etching process is carried out by applying a bias voltage in the range of 5 V to 50 V.

8. A method of forming an emitter electrode of a bipolar transistor, said emitter electrode comprising a double-layered structure of a polysilicon layer and a refractory metal suicide layer, said method comprising the steps of:
   removing a natural oxide film from a surface of a polysilicon layer by a sputter-etching process using inert gas ions by applying a bias voltage level in the range from 5 V to 50 V;
   depositing a refractory metal layer on said surface of said polysilicon layer; and
   carrying out a heat treatment to cause a silicidation reaction to form a refractory metal silicide layer over said polysilicon layer.

9. The method as claimed in claim 8, wherein said inert gas ions comprise argon ions.

10. The method as claimed in claim 8, wherein said sputter-etching process is a radio frequency plasma etching process.

11. The method as claimed in claim 8, wherein said refractory metal layer is deposited with keeping said surface of said polysilicon layer from an oxygen atmosphere after said natural oxide film is completely removed.

12. The method as claimed in claim 11, wherein said refractory metal layer is deposited in the same vacuum chamber in which said sputter-etching process has been carried out.

13. The method as claimed in claim 8, further comprising the step of: patterning laminations of the refractory metal silicide layer and the polysilicon layer.

14. The method as claimed in claim 8, wherein said inert gas ions are accelerated in the range of 5 eV to 50 eV.

15. A method of forming a double-layered structure of a polysilicon layer and a refractory metal silicide layer, said method comprising the steps of:
   removing a natural oxide film from a surface of a polysilicon layer by a sputter-etching process using inert gas ions in the range of acceleration energy from 5 eV to 50 eV, so that said inert gas ions are not implanted into said polysilicon layer;
   depositing a refractory metal layer on said surface of said polysilicon layer; and
   carrying out a heat treatment to cause a silicidation reaction to form a refractory metal silicide layer over said polysilicon layer.

16. The method as claimed in claim 15, wherein said inert gas ions comprise argon ions.

17. The method as claimed in claim 15, wherein said sputter-etching process is a radio frequency plasma etching process.

18. The method as claimed in claim 15, wherein said refractory metal layer is deposited with keeping said surface of said polysilicon layer from an oxygen atmosphere after said natural oxide film is completely removed.

19. The method as claimed in claim 18, wherein said refractory metal layer is deposited in the same vacuum chamber in which said sputter-etching process has been carried out.

20. The method as claimed in claim 15, wherein said sputter-etching process is carried out by applying a bias voltage in the range of 5 V to 50 V.

21. A method of forming a double-layered structure of a polysilicon layer and a refractory metal silicide layer, said method comprising the steps of:
   removing a natural oxide film from a surface of a polysilicon layer by a sputter-etching process using inert gas ions by applying a bias voltage level in the range from 5 V to 50 V;
   depositing a refractory metal layer on said surface of said polysilicon layer; and
   carrying out a heat treatment to cause a silicidation reaction to form a refractory metal silicide layer over said polysilicon layer.

22. The method as claimed in claim 21, wherein said inert gas ions comprise argon ions.

23. The method as claimed in claim 21, wherein said sputter-etching process is a radio frequency plasma etching process.

24. The method as claimed in claim 21, wherein said refractory metal layer is deposited with keeping said surface of said polysilicon layer from an oxygen atmosphere after said natural oxide film is completely removed.

25. The method as claimed in claim 24, wherein said refractory metal layer is deposited in the same vacuum chamber in which said sputter-etching process has been carried out.

26. The method as claimed in claim 21, wherein said inert gas ions are accelerated in the range of 5 eV to 50 eV.

27. The method as claimed in claim 22, wherein argon ions are not implanted in said polysilicon layer.

* * * * *